United States Patent [19]

Ogle

[11] Patent Number: 5,107,201
[45] Date of Patent: Apr. 21, 1992

[54] HIGH VOLTAGE OSCILLOSCOPE PROBE WITH WIDE FREQUENCY RESPONSE

[76] Inventor: John S. Ogle, 1472 Pashote Ct., Milpitas, Calif. 95035

[21] Appl. No.: 625,361

[22] Filed: Dec. 11, 1990

[51] Int. Cl.[5] ............................................. G01R 31/02
[52] U.S. Cl. .................................... 324/72.5; 324/149
[58] Field of Search ............................. 324/72.5, 149

[56] References Cited

U.S. PATENT DOCUMENTS

| | | | |
|---|---|---|---|
| 3,015,080 | 12/1961 | Santelmann, Jr. et al. | 324/149 X |
| 3,532,982 | 10/1970 | Zeidlhack et al. | 324/72.5 X |
| 4,051,432 | 9/1977 | Sarjeant | 324/72.5 |
| 4,418,314 | 11/1983 | Nieto, Jr. | 324/72.5 |
| 4,473,857 | 9/1984 | Winter | 324/149 X |

Primary Examiner—Jack B. Harvey
Assistant Examiner—Glenn W. Brown
Attorney, Agent, or Firm—Thomas E. Schatzel

[57] ABSTRACT

A high voltage probe comprises a standard high frequency coaxial cable terminated in its characteristic impedance through most of the high frequency range, and a circuit of resistors and capacitors that provide a fixed division ratio regardless of the input frequency.

9 Claims, 2 Drawing Sheets

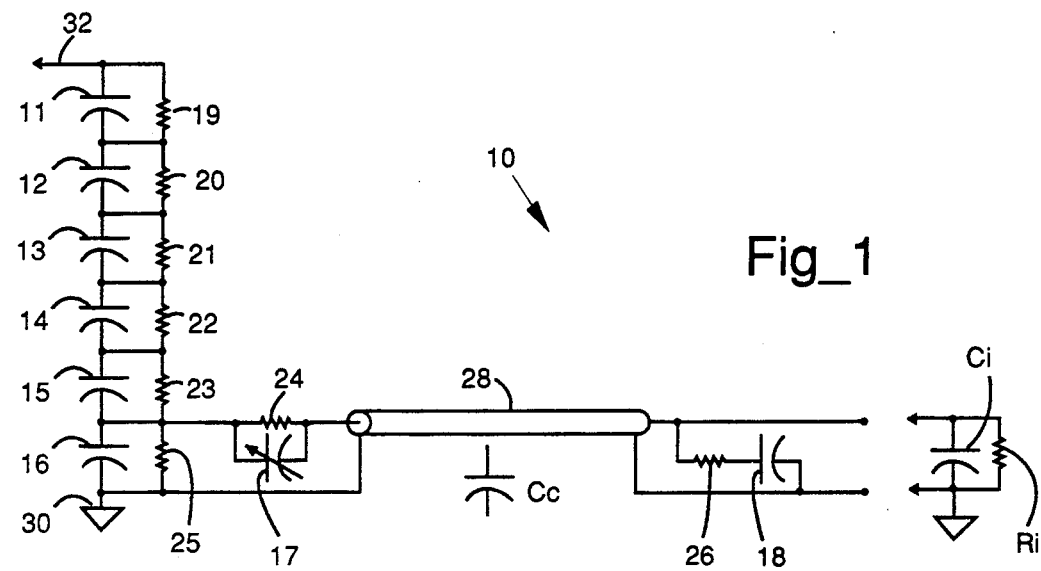
Fig_1
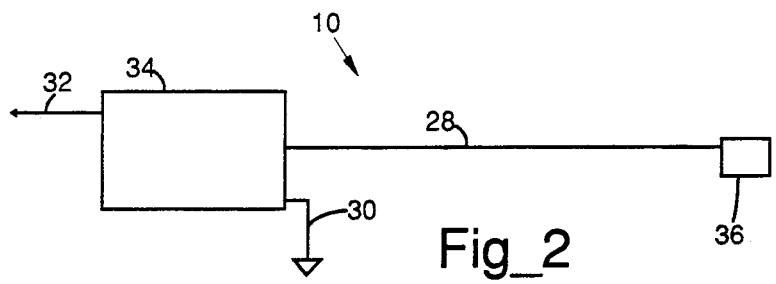
Fig_2
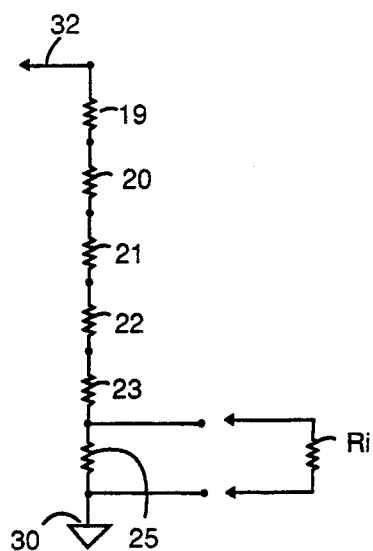
Fig_3

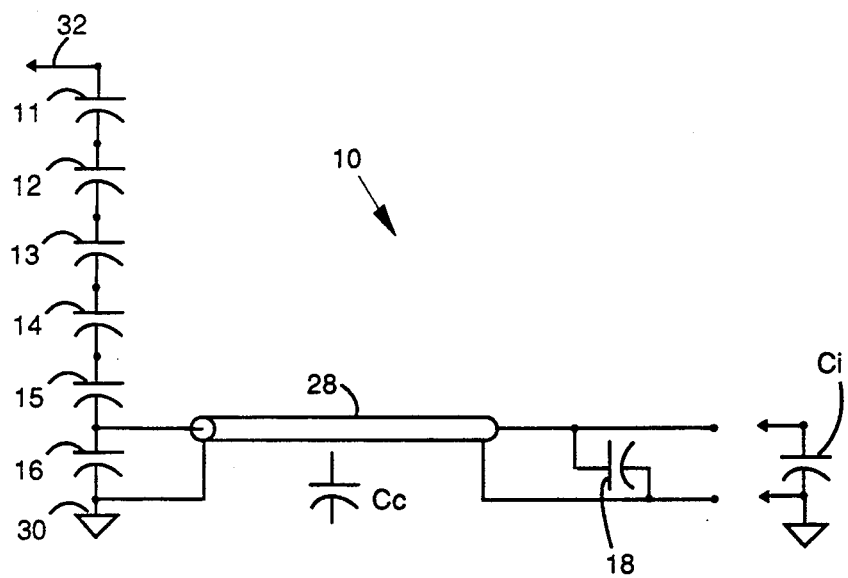
Fig_4
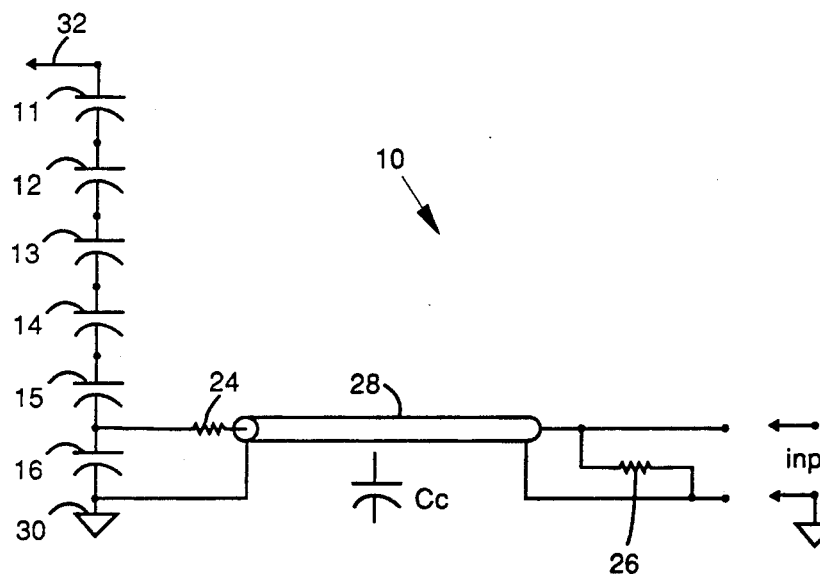
Fig_5
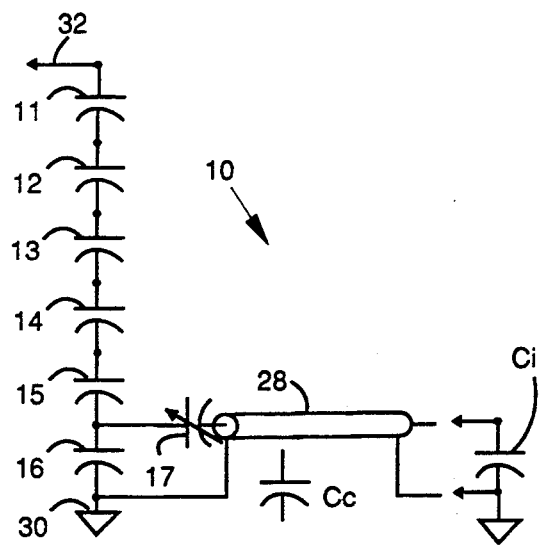
Fig_6

HIGH VOLTAGE OSCILLOSCOPE PROBE WITH WIDE FREQUENCY RESPONSE

BACKGROUND OF THE INVENTION

1. Field of the Invention

The invention relates generally to electronic measuring instruments and more specifically to high voltage probes used in conjunction with oscilloscopes.

2. Description of the Prior Art

High voltage oscilloscope probes allow the measurement of signals that exceed the voltage input range of oscilloscopes or other measuring instruments, such as spectrum analyzers. These measuring instruments typically have several input signal voltage ranges that vary from millivolts to tens of volts. They can be extended to measure from tens of volts to tens of thousands of volts by substituting the standard probe with a high voltage probe. For example, the Tektronix P6015 and Hewlett-Packard 1137A are commercially available high voltage probes that give a 1000:1 voltage division. Unfortunately, the prior art high voltage probes exhibit several limitations in their use.

Wider frequency response, higher input voltage capability, increased flexibility in terms of line length between the high voltage measuring point and the oscilloscope, and simpler calibration adjustments are needed. Some high voltage probes use environmentally harmful CFCs, such as Freon, to improve their insulation characteristics. Preferably, such materials should be eliminated, while at the same time improving performance levels.

Prior art high voltage probes have as many as seven adjustments for calibration. In addition, the relatively high input capacitance of prior art high voltage probes results in heavy loading of the voltage measurement point for high frequencies and requires the voltage capability of the probe to be derated above a relatively low frequency.

SUMMARY OF THE PRESENT INVENTION

It is therefore an object of the present invention to produce a high voltage probe that simultaneously offers wide frequency response, high input voltage capability, increased flexibility in terms of line length between the high voltage measuring point and the oscilloscope, and simple calibration adjustments.

Briefly, a high voltage probe of the present invention comprises a standard high frequency coaxial cable terminated in its characteristic impedance through most of the high frequency range, and a circuit of resistors and capacitors that provide a fixed division ratio regardless of the input frequency.

An advantage of the present invention is that a wide frequency response is realized.

Another advantage of the present invention is that a high input voltage capability is achieved.

Another advantage of the present invention is that there is increased flexibility, in terms of line length between the high voltage measuring point and the oscilloscope.

Another advantage of the present invention is that calibration adjustments are simple.

These and other objects and advantages of the present invention will no doubt become obvious to those of ordinary skill in the art after having read the following detailed description of the preferred embodiments which are illustrated in the various drawing figures.

IN THE DRAWINGS

FIG. 1 is a schematic diagram of a high voltage probe of the present invention;

FIG. 2 is a mechanical block diagram of the high voltage probe of FIG. 1;

FIG. 3 is a schematic diagram the equivalent circuit of FIG. 1 at DC to approximately 270 Hz for a preferred set of component values;

FIG. 4 is a schematic diagram the equivalent circuit of FIG. 1 at approximately 270 Hz to one megahertz for the preferred set of component values;

FIG. 5 is a schematic diagram the equivalent circuit of FIG. 1 at approximately one megahertz to 100 MHz for the preferred set of component values; and FIG. 6 is a schematic diagram the equivalent circuit of FIG. 1 above approximately 100 MHz for the preferred set of component values.

DETAILED DESCRIPTION OF THE PREFERRED EMBODIMENTS

FIG. 1 illustrates a high voltage probe, referred to by the general reference numeral 10, comprising capacitors 11–18, resistors 19–26, and a 50 Ω characteristic impedance coaxial cable 28. Resistors 19–23 are special high voltage resistors able to withstand one fifth of the applied voltage each. Capacitors 11–15 are special high voltage types able to withstand one fifth of the applied voltage each. Capacitor 17 is adjustable and is used to calibrate probe 10 to the input impedance of the measuring device. The typical oscilloscope that probe 10 will be attached to will have a input resistance of $R_i$ and an input capacitance of $C_i$. Typically, Ri will be about one megohm and Ci will be about 0.03 nfd. The capacitance of the coaxial cable is represented by capacitor $C_c$ and is about 0.3 nfd. In a preferred embodiment, capacitor 16 is 3 nanofarads (nfd.), capacitor 18 is 2.7 nfd., resistor 25 is 110 KΩ, and resistors 24 and 26 are 50 Ω each. Cable 28 is about three meters long.

FIG. 2 illustrates the basic mechanical design of probe 10. A ground lead 30 and measurement lead 32 connect the device under test (DUT) to a measurement head 34 that contains resistors 19–25 and capacitors 11–17. Measurement head 34 connects via coaxial cable 28 to a termination and connector assembly 36. Assembly 36 comprises resistor 26, capacitor 18, and a BNC connector for quick attachment to an oscilloscope. For safety, probe 10, and especially measurement head 34, are not designed to be handheld. Since probe 10 is designed to measure dangerous or lethal voltages and because it is difficult to maintain control over a handheld probe while observing the oscilloscope, the probe 10 is designed instead to mount to a work surface. A sticky fabric, such as Velcro ®, is used to hold measurement head 34 near the point to be measured on a grounded or insulated surface. The high voltage input measurement lead 32 extends from the voltage divider measurement head 34 with a maximum spacing from the mounting plane, to provide "creep" distance for high voltage isolation. In an alternative embodiment, the DC scale factor resistor 25 could be moved from the measurement head 34 to assembly 36 without significantly altering the circuit operation. For some scale factors, resistor 25 can be deleted entirely such that the oscilloscope input resistance $R_i$ alone is used for the sensing leg of a low frequency voltage divider.

FIG. 3 is the equivalent circuit of FIG. 1 for input frequencies of DC to about 270 Hertz (Hz). Capacitors 11-18 have such a high impedance at those frequencies that they can be disregarded. The voltage division is approximately 10,000:1, since the high voltage input resistors 19-23 connected in series total 1000 megohms and the parallel combination of resistor 25 and $R_i$ is approximately 100 KΩ.

FIG. 4 is the equivalent circuit of FIG. 1 for input frequencies of about 270 Hz to one megahertz. Capacitances now dominate and yet the voltage division is still approximately 10,000:1. The series capacitance of high voltage input capacitors 11-15 is 0.6 picofarads (pfd.) and the parallel capacitance of capacitors 16 and 18 with $C_c$ and $C_i$ is approximately six nanofarads. For longer cables 28, the low frequency capacitance $C_c$ will increase, and the value of capacitor 18 is reduced to maintain the total six nanofarad parallel combination.

FIG. 5 is the equivalent circuit for probe 10 for input frequencies between about one megahertz to 100 MHz. The voltage division is in two steps. First, a 5000:1 division occurs in the voltage divider comprised of capacitors 11-16. Second, a 2:1 division occurs for the resistive voltage divider comprised of resistors 24 and 26. Throughout most of this frequency range, the 50 Ω coaxial cable 28 is terminated in its characteristic impedance through resistors 24 and 26. That makes the frequency response essentially independent of cable length.

FIG. 6 is the equivalent circuit for probe 10 for input frequencies above approximately 100 MHz. Capacitor 17 is adjusted to correspond to $C_i$, the input capacitance of the oscilloscope. The voltage division is about 10,000:1 in two steps. First, a 5000:1 division for the capacitive voltage divider consisting of capacitors 11-16, and 2:1 for the capacitive voltage divider of capacitor 17 and Ci. The adjustment of capacitor 17 for the high frequency end of the bandwidth of probe 10 is the only calibration adjustment necessary.

Each high voltage input resistor 19-23 must be capable of withstanding a share of the applied voltage without a voltage breakdown or arcing. For a 50,000 volt peak measurement capability, the five resistors 19-23 must each be capable of withstanding 10,000 volts. Each resistor 19-23 must have a power dissipation capacity no less than 10,000 raised to the second power divided by the resistance ($V^2/R$). A higher resistance value for resistors 19-23 will load the voltage measurement point less, but the measurement will be more susceptible to noise. A reasonable compromise for the maximum power dissipation to be half a watt for each resistor. This results in a resistance of 200 MΩ for each resistor 19-23. The total input resistance of probe 10 will therefore be about one billion ohms (1000 M Ω). Each high voltage input capacitor 11-15 must also be capable of withstanding a peak voltage of 10,000 volts. In addition, the current carrying capability of capacitors 11-15 will determine the derating frequency at which the voltage capability of the probe starts to decrease with frequency. For a given capacitor current capability, a smaller capacitance value will allow a higher derating frequency. However, very small capacitance values (in the low picofarad ranges) are difficult to get in precise values and stray capacitances exert greater influence. By connecting several capacitors in series, a number of advantages are gained. First, relatively large capacitors with reasonably accurate values can be used and still the total series capacitance will be small. Second, the reduced capacitance value results in less voltage measurement point loading. Third, the voltage gradient is spread over several centimeters, rather than being concentrated (as with a single capacitor). A reasonable compromise for the number of capacitors is five, each with a capacitance of three picofarads and a current limit of one ampere. Assuming a sinewave input and a peak voltage of ten kilovolts for each capacitor 11-15, the frequency at which derating begins is approximately 7.5 MHz. This derating frequency is higher than for presently available high voltage probes. For five capacitors, each three picofarads, the probe input capacitance is 0.6 pfd., or approximately one picofarad when allowing for stray wiring capacitance. This input capacitance is lower than most presently available high voltage probes.

Resistors 24 and 26 should both be equal to the characteristic impedance of cable 28 for optimal termination. The two resistors 24 and 26 provide a voltage division of 2:1, which means the input capacitance voltage divider must have a division factor for AC signals that is one half of that for the resistive voltage divider for DC signals. It is possible to choose a value for resistor 24 which gives a different voltage division and then to compensate for this by modifying the capacitor voltage division, but there is normally no advantage over using equal resistance values for resistors 24 and 26. And if unequal values are used, cable 28 will have poorer termination at the input end. Resistor 25 is determined by the desired division ratio of probe 10. If probe 10 is intended to be used for voltages up to 50,000 volts, a 1000:1 voltage division will not be satisfactory, because that would result in a 50 volt full scale output (beyond the normal input range of most oscilloscopes). For a division of 10,000:1, the highest voltages can be measured conveniently. At a maximum oscilloscope sensitivity of two millivolts per division, a full screen display will typically correspond to a sinewave voltage of about 57 VRMS. Thus with a 10,000:1 division ratio, probe 10 can be used to measure voltages ranging from residential power line voltages up to tens of thousands of volts. For a 10,000:1 probe resistive voltage division and a one megohm Ri, resistor 25 is approximately 111 KΩ. Similarly, for a 10,000:1 capacitive voltage division, the sum of capacitors 16, 18, and capacitances $C_c$ and $C_i$ (about six picofarads) is 10,000 times the 0.6 pfd. capacitance of the series combination of high voltage capacitors 11-15. Since the cable 28 capacitance is typically 100 pfd./meter, $C_c$ is approximately 300 pfd. for a three meter coaxial cable. With a typical oscilloscope input capacitance $C_i$ of 25 pfd., the corresponding value of capacitor 18 is 2.675 nfd. For a nine meter cable 28, the Cc is approximately 900 pfd., and the corresponding capacitor 18 value is 2.075 nfd. Variable capacitor 17 is adjusted to match the oscilloscope input capacitance $C_i$, typically between 20 pfd. and 30 pfd. Alternatively, cable 28 may be a twisted pair or a twinlead type of wire. (Twinlead, such as 300Ω twinlead used for home television antenna lead in wire.)

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A high voltage probe for attachment to an electronic instrument, the probe having a division ratio that extends the input voltage range of the instrument, comprising:

a voltage divider having at least a first capacitor and a second capacitor connected in series such that a common electrical node is formed;

means for connecting a device-under-test to the voltage divider such that an applied voltage divides across said at least first and second capacitors;

a coaxial cable of a predetermined characteristic impedance having an inner an outer conductor and having a first and second end, the outer conductor at the first end connected to the second capacitor;

an input resistor having a first end connected to the junction of said at lest first and second capacitors in the voltage divider, and having a second end connected to the center conductor of the first end of the coaxial cable;

a termination circuit having a resistor in series with a capacitor, said resistor having a value approximately equal to the characteristic impedance of the coaxial cable, the termination circuit connected between the inner and outer conductors of the second end of the coaxial cable; and means for connecting the termination circuit to the electronic instrument.

2. The probe of claim 1, wherein:
the voltage divider comprises a first resistor in parallel with said first capacitor and a second resistor in parallel with said second capacitor.

3. The probe of claim 1, further comprising:
an input capacitor in parallel with said input resistor such that the product of the value of the input capacitor and input resistor is approximately equal to the product of the value of the input capacitance of the electronic instrument and said resistor in the termination circuit.

4. The probe of claim 3, wherein:
the voltage divider comprises a first resistor in parallel with said first capacitor and a second resistor in parallel with said second capacitor.

5. The probe of claim 4, wherein the division ratio of the probe is equal to:

the sum of the capacitances of said first and second capacitors in the voltage divider, the capacitance of the coaxial cable, said capacitor in the termination circuit, and the input capacitance of the electronic instrument, all divided by the capacitance of said first capacitor in the voltage divider, when the frequency of the input signal is between approximately 270 Hz and 1 MHz;

the sum of the capacitance of said at least first and second capacitors in the voltage divider divided by the capacitance of said first capacitor in the voltage divider, times the sum of the resistances of said input and termination resistors divided by the resistance of said termination resistor when the frequency of the input signal is between approximately 1 MHz and 100 MHz; and the product of the input resistance of the electronic instrument and the resistance of said second resistor in parallel with said second capacitor in the voltage divider, plus the product of said first and second resistors in the voltage divider, plus the product of the input resistance of the electronic instrument and the resistance of said first resistor in the voltage divider, all divided by the product of the input resistance of the electronic instrument and the resistance of said second resistor in parallel with said second capacitor in the voltage divider when the frequency of the input signal is between approximately DC and 270 Hz.

6. A high voltage probe for use with a measuring instrument, comprising:

a voltage divider having one or more high voltage resistors in series with one another and one or more high voltage capacitors in series with one another, with the resistance series circuit connected to the capacitance series circuit at both ends, a first end of the voltage divider having means to connect to a voltage measuring point, and a second end of the voltage divider connected to a grounded capacitor and resistor in parallel;

an input circuit comprised of an input resistor in parallel with an input variable capacitor;

a coaxial cable having a first end connected to the input circuit and a second end connected to a termination circuit comprised of a termination resistor approximately equal in value to the characteristic impedance of the coaxial cable, connected in series with a capacitor having a value that compensates for the capacitance of the coaxial cable; and means to connect from said termination circuit to the measuring instrument.

7. The probe of claim 6, wherein:
the voltage divider comprises five capacitors each being three picofarads and five resistors each being 200 megohms;
the coaxial cable has a characteristic impedance of 50 ohms and is approximately three meters long;
said input resistor and termination resistor are 50 ohms; and
the termination circuit comprises a BNC connector for attachment to the measuring instrument.

8. A high voltage probe for attachment to an electronic instrument, the probe having a division ratio that extends the input voltage range of the instrument, comprising:

a voltage divider having at least a first capacitor and a second capacitor connected in series such that a common electrical node is formed;

means for connecting a device-under-test to the voltage divider such that an applied voltage divides across said at least first and second capacitors;

a pair of wires of a predetermined characteristic impedance having a first and a second conductor each having a firs and second end, the second conductor at the first end connected to the second capacitor;

an input resistor having a first end connected to the junction of said at least first and second capacitors in the voltage divider, and having a second end connected to the first conductor at the first end of the pair of wires;

a termination circuit having a resistor in series with a capacitor, said resistor having a value approximately equal to the characteristic impedance of the pair of wires, the termination circuit connected between the first and second conductors of the second end of the pair of wires; and means for connecting the termination circuit to the electronic instrument.

9. The probe of claim 8, wherein:
the pair of wires comprises a twisted pair or twinlead wire.

* * * * *